United States Patent [19]
Zitta

[11] Patent Number: 5,617,285
[45] Date of Patent: Apr. 1, 1997

[54] CIRCUIT CONFIGURATION FOR DETECTING UNDERVOLTAGE

[75] Inventor: Heinz Zitta, Drobollach, Austria

[73] Assignee: Siemens Aktiengesellschaft, Munich, Germany

[21] Appl. No.: 519,123

[22] Filed: Aug. 24, 1995

[30] Foreign Application Priority Data

Aug. 24, 1994 [DE] Germany ............. 44 30 049.2

[51] Int. Cl.$^6$ .................................... H02H 3/24
[52] U.S. Cl. .................................... 361/92; 361/115
[58] Field of Search .................... 361/92, 90, 115; 327/322

[56] References Cited

U.S. PATENT DOCUMENTS

| | | | |
|---|---|---|---|
| 3,670,246 | 6/1972 | Gately | 324/133 |
| 4,618,780 | 10/1986 | Ikoma | 307/130 |
| 4,794,277 | 12/1988 | Holland | 307/296 |

FOREIGN PATENT DOCUMENTS

| | | | |
|---|---|---|---|
| 0207159 | 1/1987 | European Pat. Off. | G01R 19/165 |
| 3238544 | 10/1982 | Germany | G01R 19/165 |
| 3238544 | 5/1983 | Germany | G01R 19/165 |
| 3403798 | 2/1984 | Germany | G05B 1/02 |
| 3403798 | 8/1984 | Germany | G05B 1/02 |
| 0207159 | 12/1985 | Japan | G01R 19/165 |
| 2108342 | 5/1983 | United Kingdom | H03K 3/12 |

*Primary Examiner*—Jeffrey A. Gaffin
*Assistant Examiner*—Stephen W. Jackson
*Attorney, Agent, or Firm*—Herbert L. Lerner; Laurence A. Greenberg

[57] ABSTRACT

A circuit configuration for undervoltage detection of a voltage source includes a reference voltage source being fed by the voltage source and having a first output, a second output, and a device for generating an enable signal at the second output only whenever a reference voltage has attained a stable value. A voltage divider divides a voltage furnished by the voltage source and supplies an output voltage. A comparator has a first input connected to the first output of the reference voltage source, a second input receiving the output voltage of the voltage divider, an output for supplying a detection signal, and a switching device being triggered by the enable signal for enabling the output of the comparator only after the enable signal has been generated.

3 Claims, 2 Drawing Sheets

FIG.3
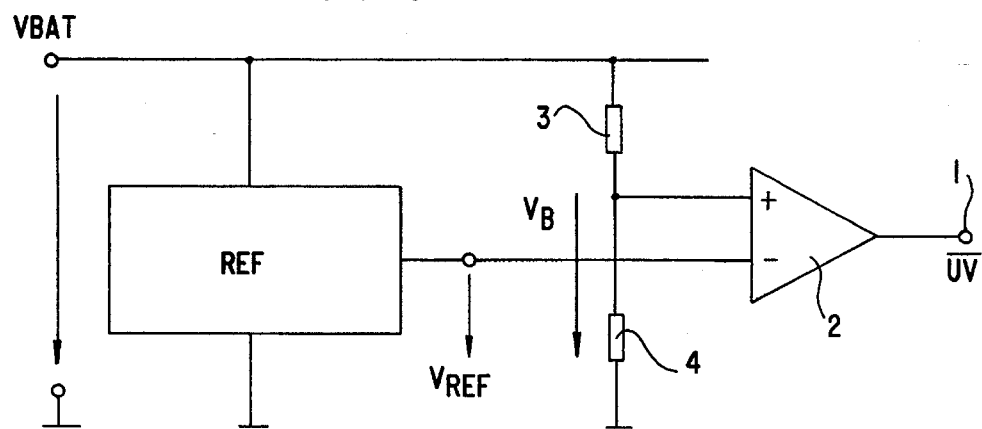
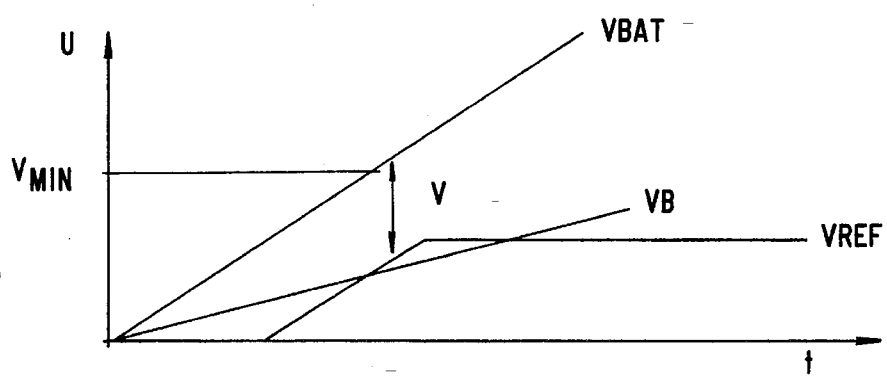
FIG.4A
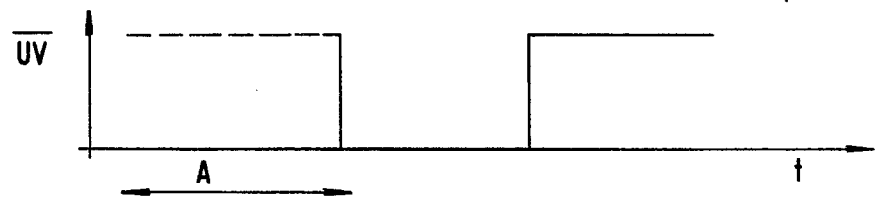
FIG.4B 5,617,285

CIRCUIT CONFIGURATION FOR DETECTING UNDERVOLTAGE

BACKGROUND OF THE INVENTION

Field of the Invention

The invention relates to a circuit configuration for detecting undervoltage of a voltage source, including a reference voltage source being fed by the voltage source and having an output being supplied to a first input of a comparator, a voltage divider for dividing a voltage furnished by the voltage source having an output being supplied to a second input of the comparator, and the comparator having an output at which a detection signal can be tapped.

Especially in battery-powered devices, a circuit configuration for detecting undervoltage performs an important function. In order to detect undervoltage, a comparator and a reference voltage source are used in most cases. However, the reference voltage source is usually supplied from the same voltage source, namely the source that is to be monitored. Such a configuration is shown in FIG. 3 and described in greater detail below. In practice that configuration presents problems if a reference voltage source is supplied from the same voltage.

Another such monitoring circuit is shown in German Published, Non-Prosecuted Application DE 34 03 798 A1, corresponding to U.S. Pat. No. 4,618,780, in which a proportional voltage being referred to the supply voltage and generated through the use of a voltage divider is compared in a comparator with a reference voltage.

In German Published, Non-Prosecuted Application DE 32 38 544 A1, corresponding to U.K. Application GB 2 108 342 and in European Application 0 207 159 A1, comparator circuits are described that contain a switching device through the use of which the output of the comparator can be enabled for voltage monitoring. U.S. Pat. No. 3,670,246 describes a circuit for voltage monitoring, in which undesired emission of a signal when the voltage source is turned on is prevented by using a capacitor that delays the switching of the comparator stage in a defined manner.

Summary of the Invention

It is accordingly an object of the invention to provide a circuit configuration for undervoltage detection, which overcomes the hereinafore-mentioned disadvantages of the heretofore-known devices of this general type, which has a switching threshold that is determined by a reference voltage circuit and which operates more reliably upon activation of an operating voltage.

With the foregoing and other objects in view there is provided, in accordance with the invention, a circuit configuration for undervoltage detection of a voltage source, comprising a reference voltage source being fed by a voltage source and having a first output, a second output, and a device for generating an enable signal at the second output only whenever a reference voltage has attained a stable value; a voltage divider for dividing a voltage furnished by the voltage source and for supplying an output voltage; and a comparator having a first input connected to the first output of the reference voltage source, a second input receiving the output voltage of the voltage divider, and an output for supplying a detection signal, and a switching device being triggered by the enable signal for enabling the output of the comparator only after the enable signal has been generated.

In accordance with a concomitant feature of the invention, the reference voltage source includes a band gap circuit configuration and a regulating stage, the regulating stage has a regulating transistor with a load path having a voltage drop, during a regulation operation, as soon as the voltage source exceeds a predetermined voltage value, and the voltage drop triggers the switching device of the comparator.

The circuit configuration has the advantage of reliably suppressing undesired emission of a signal if the operating voltage of the entire circuit is too low to assure proper functioning of the reference voltage circuit. Undesired emission of a signal is to be reliably suppressed particularly upon activation of the voltage source.

Other features which are considered as characteristic for the invention are set forth in the appended claims.

Although the invention is illustrated and described herein as embodied in a circuit configuration for detecting undervoltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a schematic and block diagram of a circuit configuration according to the prior art; and FIG. 4 is a diagram of a voltage course of the circuit of FIG. 3 which is constructed in accordance with the prior art.

DESCRIPTION OF THE PREFERRED EMBODIMENTS

Figure 1:
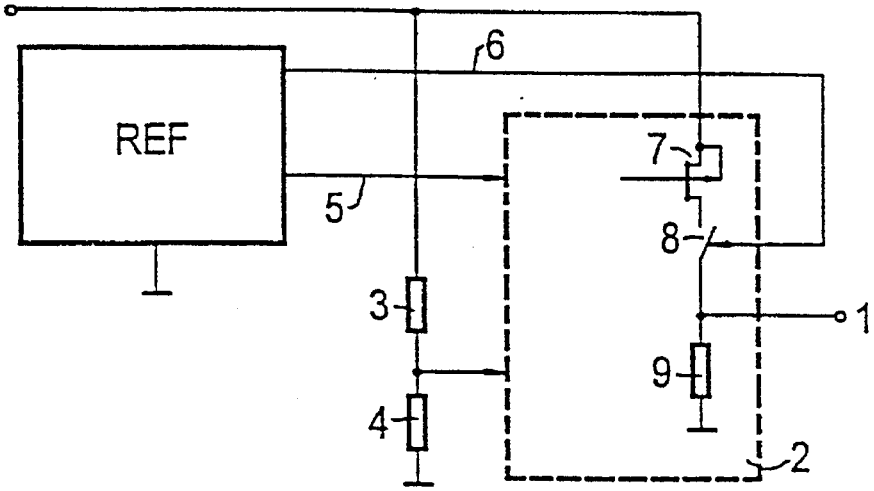
FIG. 1 is a schematic and block circuit diagram of a configuration according to the invention.

Referring now to the figures of the drawing in detail and first, particularly, to FIG. 3 thereof, there is seen a prior art configuration for detecting undervoltage which performs an important function, especially in battery-powered devices. In order to detect undervoltage, a comparator and a reference voltage source are used in most cases. However, the reference voltage source is usually supplied from the same voltage source, namely the source that is to be monitored. An input terminal, for instance a battery terminal, is indicated by reference symbol VBAT and supplies both a reference voltage source REF and a voltage divider 3, 4. A voltage $V_B$ that is supplied to a positive input of a comparator 2 can be tapped at a node point of the voltage divider. An output voltage $V_{REF}$ generated by the reference voltage source REF is supplied to a negative input of the comparator 2. An output terminal at which an output voltage $\overline{UV}$ of the comparator can be tapped, is identified by reference numeral 1.

A corresponding voltage course is shown in the associated FIG. 4. An upper diagram shows the course of the input voltage, that is the reference voltage, and the voltage $V_B$ at the voltage divider, plotted over time. In a lower diagram, the associated course of the output voltage $\overline{UV}$ is shown.

The voltage VBAT is monitored by this configuration. To that end, the voltage VB, which is divided by the voltage divider 3, 4, is compared with the reference voltage $V_{REF}$ generated by the configuration. If with increasing voltage VBAT the corresponding concurrent voltage $V_B$ rises above the reference voltage $V_{REF}$, then the output $\overline{UV}$ of the comparator switches from low to high and signals that there is no undervoltage.

In practice that configuration presents problems if the reference voltage source is supplied from the same voltage, as is the case in the example shown in FIG. 3. In FIG. 4, the problem area is indicated by reference symbol A. The voltage $V_{REF}$ is still lower than the voltage VBAT and stabilization does not occur until at a certain value of VBAT. For reasons of circuitry, a minimum offset $\overline{\Delta V}$ of VBAT relative to $V_{REF}$ is unavoidable. At very low voltage VBAT, the reference voltage $V_{REF}$ is equal to zero, but the voltage $V_B$ is still proportional to VBAT and therefore is always greater than zero. In a certain range, which is indicated by reference symbol A in the lower diagram, the signal $\overline{UV}$ is therefore logically false, and the correct function is only assured after a certain input voltage VBAT>VMIN.

The invention solves the problem discussed above by monitoring the reference voltage source in such a way that an unequivocal signal is generated if that source, at undervoltage, is no longer operating reliably. This control signal then intervenes in a monitoring comparator, which finally always outputs a logically correct signal, namely undervoltage or no undervoltage.

In FIG. 1, a terminal VBAT is again shown, which supplies both a reference voltage source REF and a voltage divider 3, 4. The terminal VBAT also supplies an output circuit 2. A first output supplies a reference output voltage 5 which is fed to a first input of this output circuit 2, whereas a voltage that can be tapped at the voltage divider 3, 4 is fed to a second input of the output circuit 2. The output circuit 2 includes not only a comparator but also a switchable output stage, which by way of example includes a first switching transistor 7 triggered by the comparator and a series-connected switching device 8, that are connected to reference potential through a resistor 9. The output voltage terminal 1 can then be tapped at a node point of the resistor 9 and the switching device 8. The reference voltage source REF generates a second or enable signal 6 at a second output which indicates whether or not the reference is already operating in its stable operating range, and the reference voltage source REF controls the switching device 8 with this signal 6.

Any function of the output circuit 2 having the comparator, that triggers the output switching transistor 7, is deactivated through the switching device 8 as long as the reference voltage has not yet reached its stable operating range. Through the use of the pull-down resistor 9, the output signal at the terminal 1 is pulled to logical "zero". In this way it can be reliably assured that the logically correct signal will always be present at the output 1, regardless of the level of the output voltage of the terminal VBAT.

Figure 2:
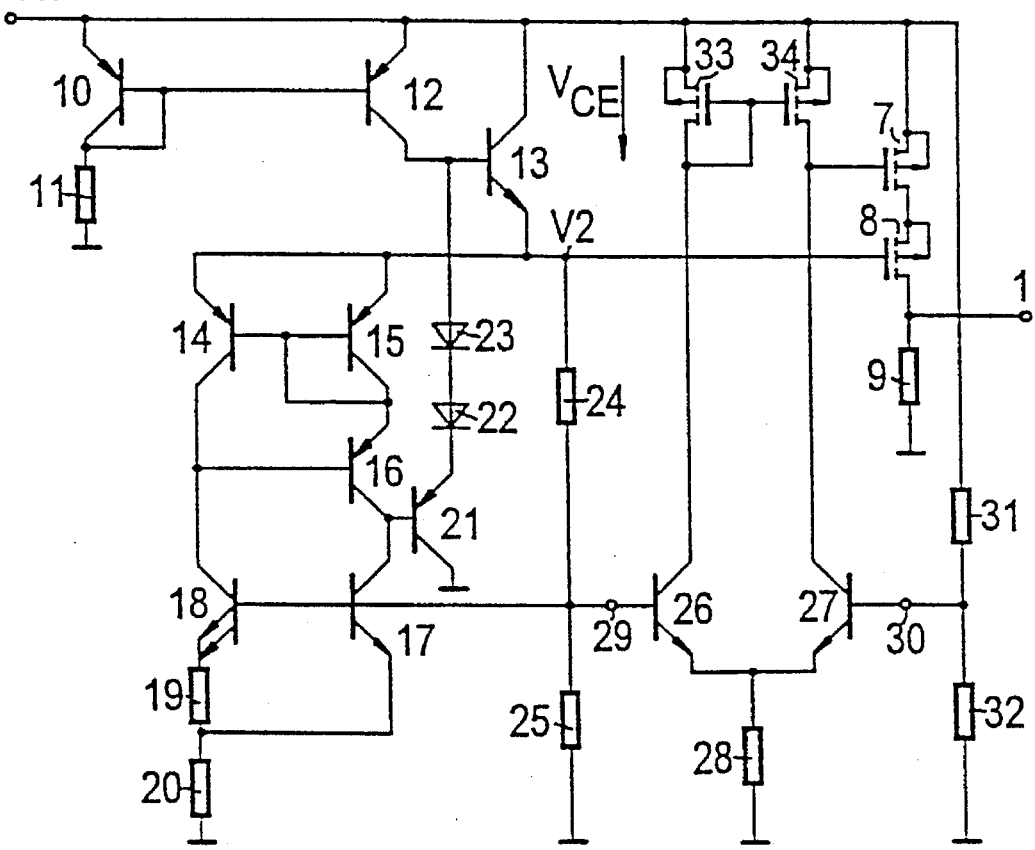
FIG. 2 is a schematic diagram of an exemplary embodiment of a circuit configuration according to the invention.

FIG. 2 shows the associated exemplary embodiment of such a circuit according to FIG. 1. The terminal VBAT is connected to ground through a pnp transistor 10 that is connected as a diode, and a series connected resistor 11. Base and collector terminals of the transistor 10, which are connected with the resistor 11, are also connected to a base of a pnp transistor 12. An emitter of the pnp transistor 12 is connected to the terminal VBAT. A collector of the transistor 12 is connected both to a base of an npn transistor 13 and to a series circuit of two diodes 22, 23 that are connected in the current flow direction. The series circuit of the diodes 22, 23 is connected to the reference potential through an emitter-to-collector path of a pnp transistor 21. A collector of the transistor 13 is connected to the terminal VBAT, and an emitter of the transistor 13 is connected to the reference potential through a first resistance divider 24, 25. The emitter of the transistor 13 is also connected both to emitters of further pnp transistors 14 and 15 and to a gate terminal of an MOS transistor 8. Base terminals of the transistors 14 and 15 are connected to one another and to a collector of the transistor 15. A collector of the transistor 14 is connected to a base of a further pnp transistor 16 and to a collector of a further npn transistor 18. An emitter of the transistor 16 is connected to the collector of the transistor 15, and a collector of the transistor 16 is connected to a base of the transistor 21 and to a collector of a further npn transistor 17.

Base terminals of the transistors 18 and 17 are coupled to one another and to a node point of the resistance divider 24, 25. An emitter of the transistor 18 is connected to the reference potential through a second resistance divider 19, 20. A node point of the resistance divider 19, 20 is connected to an emitter of the transistor 17. The mode point of the first resistance divider 24, 25 is connected to a terminal 29 that is connected to a base of a further npn transistor 26. A further npn transistor 27 has an emitter which is connected to an emitter of the transistor 26 and through a resistor 28 to the reference potential. A collector of the transistor 26 is connected to source and gate terminals of an MOS transistor 33. A drain terminal of the MOS transistor 33 is connected to the terminal VBAT. A further MOS transistor 34 has a drain terminal which is likewise connected to the terminal VBAT and has a base which is connected to the source and the base of the transistor 33. A source terminal of the MOS transistor 34 is connected to a collector of the transistor 27 and to a base terminal of a further MOS transistor 7. Load paths of the MOS transistors 7 and 8 are connected in series between the terminal VBAT and the resistor 9 leading to the reference potential. A tap that is connected to the outlet terminal 1 is provided between a source terminal of the MOS transistor 8 and the resistor 9. Finally, a further, third resistance divider 31, 32 is connected between the terminal VBAT and the reference potential. A center tap of the divider 31, 32 is connected to a terminal 30 and to a base terminal of the transistor 27. A mode point between the emitter of the transistor 13 and the resistance divider 24, 25 is indicated by reference symbol V2.

Elements 14–20 form a bandgap reference circuit, many kinds of which are known and used as a voltage reference. The reference voltage $V_{REF}$ can then be tapped at the terminal 29. It will always be in the range of 1.2 V, for instance, and through the resistance divider 24, 25, an internal operating voltage for the remainder of the circuit is defined at the node point V2. If the circuit is to function reliably, this voltage must not be made any lower than 2.8 V, for instance. The result is a minimum required operating voltage:

$$VBAT\ (min) = V2 + VBE\ (13) + VCEsat\ (12),$$

in which VBE (13) is the base-to-emitter voltage of the transistor 13, and VCEsat (12) is the collector-to-emitter voltage at the transistor 12. This latter voltage may then, for instance, be $$2.8\ V + 0.7\ V + 0.1\ V = 3.6\ V.$$

In the case of a voltage VBAT<3.6 V, the reference voltage $V_{REF}$ will therefore not assume the correct value. However, in the case of each voltage higher than 3.6 V, the voltage at the node V2 remains constantly at 2.8 V. The remaining voltage drop then occurs at the collector-to-emitter path of the transistor 13. This voltage VCE (13) is interpreted as a signal for the attainment of the stable state of the reference voltage $V_{REF}$. It is not until VCE (13) is less than 0.8 V, for instance, that the p-channel transistor 8 becomes conducting and enables the output of the comparator. It is assumed in this example that the threshold voltage of the p-channel transistor 8 is always greater than 0.8 V.

I claim:

1. A circuit configuration for undervoltage detection of a voltage source, comprising:

a reference voltage source being fed by a voltage source and having a first output, a second output, and a device for generating an enable signal at said second output only whenever a reference voltage has attained a stable value;

a voltage divider for dividing a voltage furnished by the voltage source and for supplying an output voltage; and a comparator having a first input connected to said first output of said reference voltage source, a second input receiving the output voltage of said voltage divider, and an output for supplying a detection signal, and a switching device being triggered by the enable signal for enabling said output of said comparator only after the enable signal has been generated.

2. The circuit configuration according to claim 1, wherein said reference voltage source includes a band gap circuit configuration and a regulating stage, said regulating stage has a regulating transistor with a load path having a voltage drop, during a regulation operation, as soon as the voltage source exceeds a predetermined voltage value, and the voltage drop triggers said switching device of said comparator.

3. The circuit configuration according to claim 1, including a transistor having a collector-emitter-voltage, said enable signal being derived from a change in said collector-emitter-voltage of said transistor.

* * * * *